US010360952B2

(12) United States Patent
Jung et al.

(10) Patent No.: US 10,360,952 B2
(45) Date of Patent: Jul. 23, 2019

(54) MULTIPORT MEMORY ARCHITECTURE FOR SIMULTANEOUS TRANSFER

(71) Applicant: OMNIVISION TECHNOLOGIES, INC., Santa Clara, CA (US)

(72) Inventors: Taehyung Jung, Santa Clara, CA (US); Jongsik Na, San Ramon, CA (US); Sunny Ng, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 312 days.

(21) Appl. No.: 15/385,556

(22) Filed: Dec. 20, 2016

(65) Prior Publication Data
US 2018/0173456 A1 Jun. 21, 2018

(51) Int. Cl.
*G06F 12/00* (2006.01)
*G11C 7/10* (2006.01)
*G11C 11/4076* (2006.01)
*G11C 11/4093* (2006.01)
*G11C 11/4096* (2006.01)

(52) U.S. Cl.
CPC .......... *G11C 7/1042* (2013.01); *G11C 7/1087* (2013.01); *G11C 11/4076* (2013.01); *G11C 11/4093* (2013.01); *G11C 11/4096* (2013.01)

(58) Field of Classification Search
CPC . G11C 7/1042; G11C 7/1087; G11C 11/4076; G11C 11/4093; G11C 11/4096
USPC .......................................................... 711/105
See application file for complete search history.

(56) References Cited

U.S. PATENT DOCUMENTS

| 5,530,670 | A | * | 6/1996 | Matsumoto | ............ | G11C 7/103 365/189.12 |
| 8,370,557 | B2 | | 2/2013 | Dama et al. | | |
| 2004/0257846 | A1 | * | 12/2004 | Lee | ...................... | G11C 7/1045 365/30 |
| 2009/0254698 | A1 | | 10/2009 | Kwon et al. | | |
| 2011/0035644 | A1 | * | 2/2011 | Madan | ................ | G06F 11/1048 714/758 |

(Continued)

FOREIGN PATENT DOCUMENTS

CN 103745681 4/2014

OTHER PUBLICATIONS

ROC (Taiwan) Patent Application No. 106144492—Office Action with English Translation dated Nov. 9, 2018, 15 pages.

*Primary Examiner* — Mardochee Chery
(74) *Attorney, Agent, or Firm* — Christensen O'Connor Johnson Kindness PLLC

(57) ABSTRACT

Multiport memory architecture is disclosed herein. An example memory includes an input port, a memory array, and an output port. The input port is coupled to receive data blocks and includes first and second buffers coupled to temporarily store alternate data blocks, and the output port is coupled to provide data blocks from the memory array. The memory array is partitioned into first and second partitions, with the first partition coupled to receive data blocks from the first buffer and the second partition coupled to receive data blocks from the second buffer, and the input port and the memory array are coupled to receive control signals to simultaneously receive a first data block at the first buffer, transfer a second data block from the second buffer to a first address in the second partition, and provide a third data block stored at a third address of the first partition.

20 Claims, 6 Drawing Sheets

(56) References Cited

U.S. PATENT DOCUMENTS

2013/0054885 A1    2/2013   Choi
2014/0215164 A1    7/2014   Lee et al.
2015/0213854 A1    7/2015   Cordero et al.

* cited by examiner

MULTIPORT MEMORY ARCHITECTURE FOR SIMULTANEOUS TRANSFER

TECHNICAL FIELD

This disclosure relates generally to memory, and in particular but not exclusively, relates to multiport DRAM.

BACKGROUND INFORMATION

Display systems, especially high definition and high frame rate, require the movement of lots of image data quickly. The image data may typically include a high number of bits as well. Conventional display systems may include on-board memory, such as dynamic random access memory, to temporarily store the image data between receipt of the data and image generation based thereon. As the resolution and frame rate increases, the movement of the image data into and out of the on-board memory may become a bottle neck to image generation. For example, conventional DRAM may only include a single data port that is time-multiplexed between inputs and outputs. While dual or multi-port memory may exist, the conventional examples of such typically incur a size and/or power penalty due to the conventional multi-port design. As such, smaller and more efficient multi-port memory may be desirable that may be used in small form factor components.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
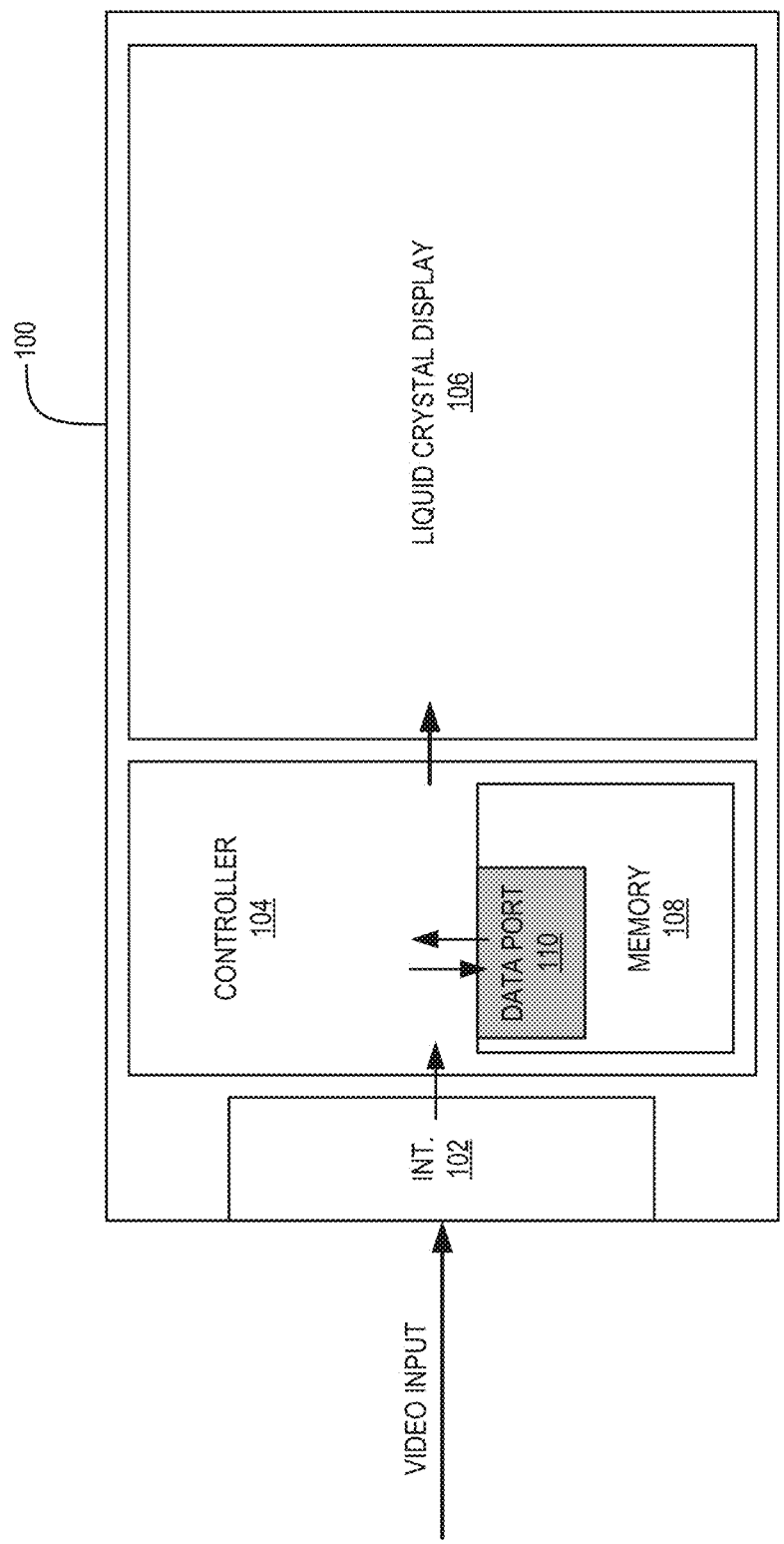
FIG. 1 is an example display system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for multiport memory architecture are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is an example display system 100 in accordance with an embodiment of the present disclosure. The display system 100 may be a liquid crystal based display with associated control and interface electronics. The illustrated embodiment of the display system 100 includes an interface 102, a controller 104, a liquid crystal display 106, and a memory 108.

In some embodiments, the interface 102 may be a digital interface coupled to receive digital video input. For example, the interface 102 may be MIPI Alliance-based protocol compliant. In such an embodiment, the video input may be received as symbols, which may be converted into bits by the interface 102. The interface 102 may receive the video input and provide the input to the controller 104, for example. In some embodiments, the video input may be received at a frequency of around 800 MHz.

The controller 104 may be a microcontroller coupled to control the operation of the display system 100. For example, the controller 104 may manipulate the video input and/or route the video input to the liquid crystal display 106 to be displayed as desired. In some embodiments, the controller 104 may include one or more memories, such as the memory 108, and be coupled to receive the video input via the interface 102. The one or more memories of the controller 104 may temporarily store data and/or commands related to the generation of images via the liquid crystal display 106. For example, the controller 104 may organize and/or manipulate the received video input before or after the video input is temporarily stored in the memory 108, for example.

The liquid crystal display 106 may be a CMOS-based display that includes an array of pixels to generate images based at least in part on the received video input. In some embodiments, the liquid crystal display 106 may generate high definition images at 60 to 100 frames per second at a resolution of up to 720 p. The liquid crystal display 106 may be back lit so that the images may be viewed and/or projected from a front surface, for example.

The illustrated embodiment of the memory 108 includes a data port 110. In some embodiments, the data port 110 may be a dual port having a dedicated input port and a dedicated output port. In some embodiments, the memory 108 may be a dynamic random access memory (DRAM) configured to temporarily store video input data before it is provided to the liquid crystal display 106. However, other types of memory may also be implemented, such as SRAM, flash, PRAM, MRAM, and the like. In some embodiments, a memory array of the memory 108 may be partitioned into at least two partitions, which may allow for the memory 108 to be read from and written to simultaneously due in part to buffers included in, or associated with, an input side of the data port 110. For example, a data block may be received by the memory 108 at an input side of the data port 110, and the data block may be written to a first buffer included in the data port 110. Simultaneously, data may be read from the memory 108 at a memory location designated by an address and provided as read data by an output side of the data port 110. Additionally, and also simultaneously with the write and the read operations, data from a second buffer of the data port 110 may be transferred to a location in the memory 108. In some embodiments, the read data may be provided from one partition and the transferred data may be moved to another partition.

The display system 100 may provide image production capabilities to various host systems. In some embodiments, the display system 100 may have a small form factor that lends itself well to being incorporated into wearable technology, such a head up displays, or miniature projection systems. The dual aspect of the data port 110 may allow the display system 100 to have a fast response time to inputs due to the ability to simultaneously read and write to memory address of the memory 108. This may be in contrast to conventional DRAMs that only include a single access port that is time shared between reading and writing.

Figure 2:
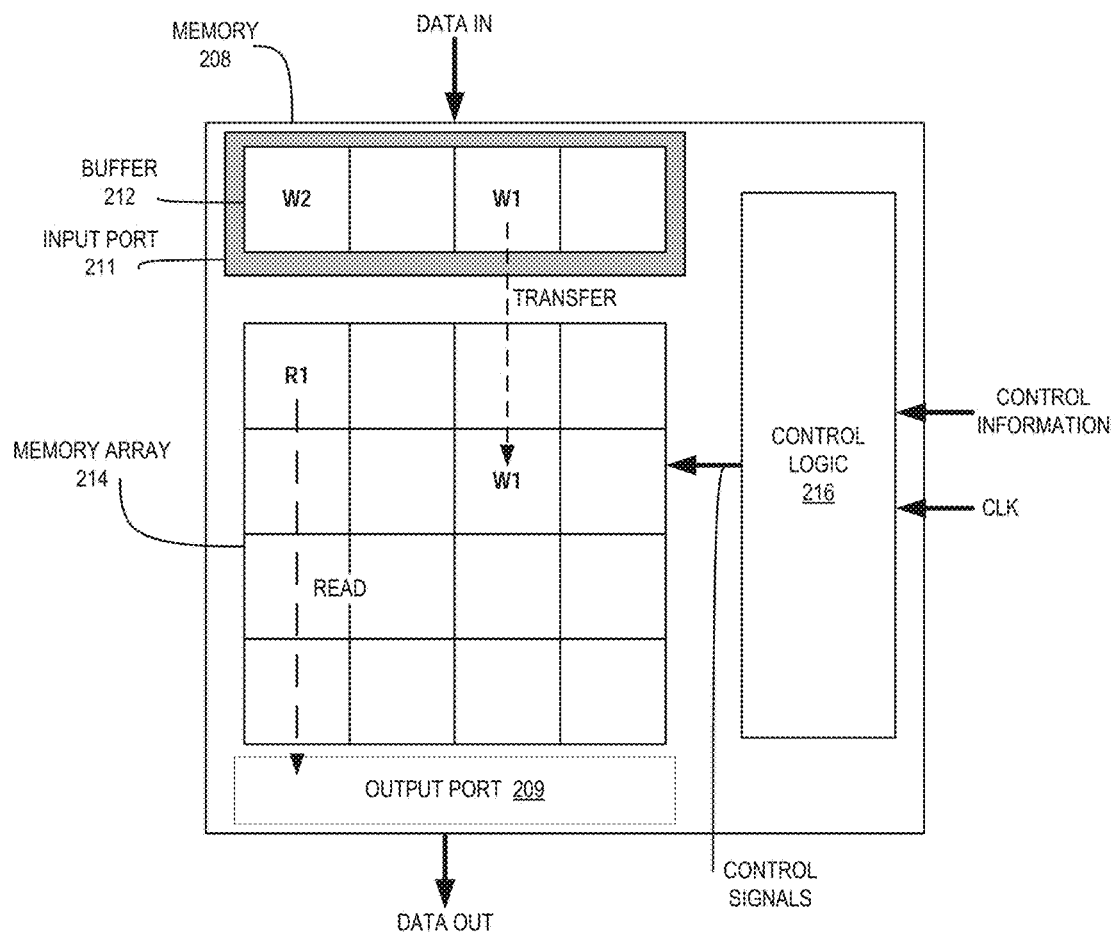
FIG. 2 is an example block diagram of a memory in accordance with an embodiment of the present disclosure.

FIG. 2 is an example block diagram of a memory 208 in accordance with an embodiment of the present disclosure. The memory 208 may be an example of the memory 108. The illustrated embodiment of the memory 108 may include an input port 211, a memory array 214, control logic 216, and an output port 209. The memory 208 may receive DATA IN, for example, at the input port 211 and provide DATA OUT at the output port 209.

The input port 211 may be an input side of the data port 110, for example. The illustrated embodiment of the input port 211 may include a buffer 212. In some embodiments, the buffer 212 may be divided into two or more partitions or formed from two or more separate buffers. In some embodiments, the buffer 212 may be a first-in, first-out (FIFO) buffer that allows for asynchronous data input. The input port 211 may be coupled to receive DATA IN, which may be in the form of data blocks, and temporarily store the DATA IN in the buffer 212 before being transferred into a memory location of the memory array 214. Storing DATA IN in the buffer 212 may comprise writing DATA IN into the buffer 212. For example, a first data block may be temporarily stored in, e.g., written into, a first buffer or first partition of the buffer 212 prior to being stored at, e.g., transferred to, an address of the memory array 214. In some embodiments, the buffer 212 may be a single row of the memory array 214.

The memory array 214 may likewise be divided into two or more partitions. In some embodiments, each partition of the memory array 214 may be associated with a respective partition, or separate buffer, of the input port 211. The memory array 214, which may be 64 rows deep and 1820 bits wide for example, may store the data blocks at designated addresses in each of the two or more partitions, and provide the same. In some embodiments, data lines of each of the two or more partitions of the memory array 214 may be accessed separately and simultaneously. However, the data lines may not be used to read from each of the two or more partitions simultaneously. Instead, data lines of one partition may be used to write to an address in the respective partition of the memory array 214 while the data lines of one of the other partitions may be used to read from an address within that partition.

The control logic 216 may receive a clock signal CLK and control information from an external source, such as the controller 104, and control the movement of data into, out of, and within the memory array 214. The control logic 216 may provide control signals to the memory array 214, input port 211, and output port 209 to choreograph the movement of the data blocks. The control signals may include commands and memory address, for example, with the commands at least including writes, reads, and transfers. In some embodiments, the transfer commands may be internally generated by the control logic 216 in response to an externally provided read and write commands. The transfers commands may cause data blocks to be moved from the buffer 212 to the memory array 214, for example. In some embodiments, the control signals may be provided by the controller 104 and the memory 208 may not include the control logic 216 in such an embodiment.

In some embodiments, the memory 208 may perform parity checks and/or error correction operations on the data received and read. In such an embodiment, the memory 208 may add the additional parity/error correction bits to each data block before the data block is written into the buffer 212 or a respective partition of the memory array 214.

The output port 209 may be an output side of the data port 110, for example, and may provide data from the memory array 214 in response to read operations. In some embodiments, the output port 209 may only be used by one of the one or more partitions at a time, and may include an output driver, and a multiplexer, for example.

In operation, the memory 208 may be able to simultaneously write and read data due at least in part to the buffer 212 of the input port 211. For example, as data block W2 is written into the buffer 212, data block W1 may be transferred to an address in the memory array 214, and simultaneously data block R1 may be read out of the memory 208. It should be noted that data block W1 is being transferred from a different buffer partition than data W2 is being written into. Additionally, data block R1 is being read from a different partition of the memory array 214 than data block W1 is being transferred into.

Figure 3:
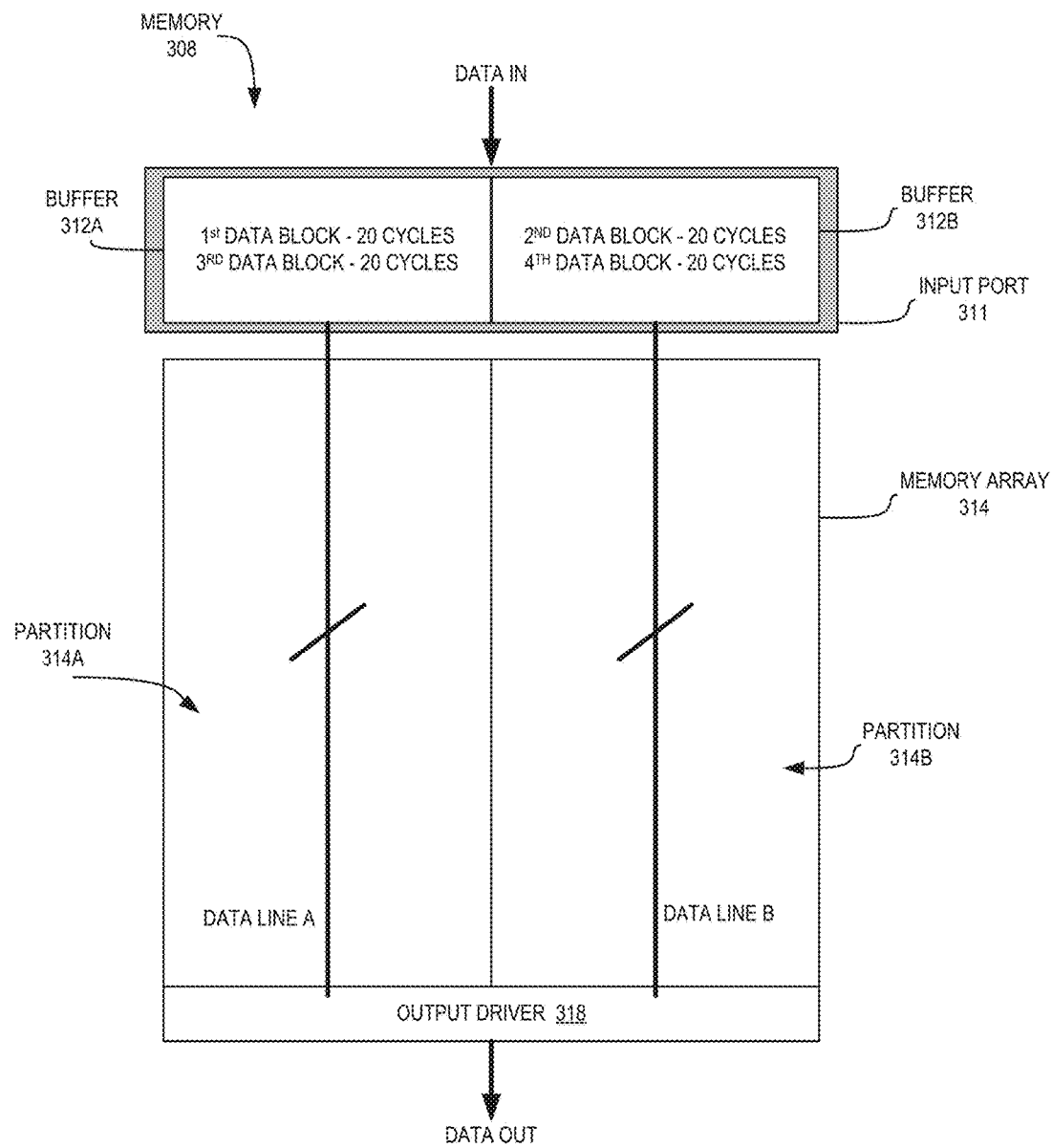
FIG. 3 is a block diagram of an illustrative memory in accordance with an embodiment of the present disclosure.

FIG. 3 is a block diagram of an illustrative memory 308 in accordance with an embodiment of the present disclosure. Memory 308 may be an example of memory 108 and/or 208. The illustrated embodiment of the memory 308 includes an input port 311, a memory array 314, and an output driver 318. The memory 308, at least in part due to having two ports, may be able to read and write data simultaneously. In some embodiments, a data transfer from a buffer of the input port 311 to a memory address of the memory array 314 may occur along with the read and write operations.

The illustrated embodiment of the input port 311 at least includes buffers 312A and 312B. The buffers 312A and 312B may be separate and distinct buffers or the buffer 312 may be divided into two partitions. The buffers 312A and 312B may be coupled to receive every other data block of the DATA IN, which may include 128 bits for example. For example, buffer 312A may receive even data blocks while buffer 312B may receive odd data blocks of the DATA IN. Of course, the opposite assignment may be possible, e.g., odd to buffer 312A and even to buffer 312B. In some embodiments, buffers 312A and 312B may only store one data block at a time, but of course other depths may be implemented. For example, the buffers 312A and 312B may be one bit deep and as wide as desired. In some embodiments, the width of the buffers 312A and 312B may each be 3840 bits, but of course other widths are also possible. However, the depth and width of the buffers 312A and 312B should not be considered limiting. In general, it may be desirable to have the width of both the buffers 312A and 312B be as wide as each data block to speed up writing and transferring the data into and out of the buffers.

The memory array 314 may be a CMOS-based DRAM array formed into lines and columns with the lines designated as word lines and the columns designated as bit lines. However, the opposite may also be implemented. Additionally, the memory array 314 may be partitioned into two partitions 314A and 314B, with each partition including respective DATA LINES, such as DATA LINE A and DATA LINE B. DATA LINE A and B may represent a plurality of data lines, which may also be referred to as bit lines. For example, DATA LINES A and B may both be 192 bits wide. In some embodiments, the two partitions 314A and 314B may be associated with respective buffers 312A and 312B such that transfers of data blocks from buffer 312A are transferred to addresses within partition 312A, and likewise for partition 314B and buffer 314B. In some embodiments, the buffers 312A and 312B may be a single row of respective partitions 314A and 314B.

The output driver 318, which may be the output port 209, may be coupled to receive read data from the memory array 314. The read data may be provided by the output driver 318 in response. The output driver 318 may be shared between the two partitions 314A and 314B, but may only provide data from one partition at a time. In some embodiments, the output driver 318 may include pull up and pull down transistors coupled to outputs of the memory 308, and the pull up and pull down transistors may be coupled to the partitions 314A and 314B via a multiplexer, for example.

In some embodiments, the data blocks may be formed from five sub-blocks, with each sub-block including 960 bits of information. The 960 bits may be formed from five 192 bit blocks that may include 128 bits of data along with command, address and error correction code, for example. In some embodiments, each block may include 128 bits of data with the extra 64 bits generated by the memory 308 due to parity/error correction code (ECC) operations. The extras 64 bits may then be amended to the received 128 bits and stored together within the memory 308, such as in the buffers 312A and 312B and in partitions 314A and 314B. As such, each data block may include 3840 bits of information. Accordingly, in some embodiments, the width of the buffers 312A and 312B, and by extension, the width of partitions 314A and 314B, may be 3840 bits wide. Further, it may take 20 cycles of a clock signal, such as the clock signal CLK, to clock in, e.g., write, each data block into the buffers 312A and 312B with each cycle clocking in 128 bits and generating the additional 64 parity/ECC bits. In some embodiments, each sub-block may be clocked in in four clock cycles. Of course, other numbers of clock cycles may be implemented for clocking in each data block and/or sub-block, and the example of 20 cycles should not be interpreted as limiting. For example, the each data block and/or sub-block may be clocked in using any number of desired data cycles, such as 5, 10, 12, 15, 18, 22, etc.

In operation, the memory 308 may receive a sequence of data blocks that form DATA IN. The sequence of data blocks may be from the video input as shown in FIG. 1, for example. The data blocks may be clocked into the memory 308 based on a clock signal CLK. A first data block may be temporarily stored in, e.g., written to, buffer 312A, and the first data block may include the received data plus the parity/ECC bits generated by the memory 308. When the first data block is received after initiation of the memory 308, or after a system reset for example, buffer 312B may be empty and no other operations may be formed. However, if there is data within the buffer 312B when the first data block is received, then such data may be transferred to partition 314B during receipt of the first data block.

Continuing on with the example and assuming that there is no data in buffer 312B when the first data block is received, a second data block may be received subsequent to the first data block. The second data block, in response to control signals, may be written into buffer 312B, however. During receipt of the second data block, the first data block may be transferred to an address within partition 314A. Additionally, and during receipt of the second data block, a read operation may be performed from partition 314B. Because partitions 314A and 314B include separate data lines, one may be written to while the other is read from.

After receipt of the second data block, a third data block may be received and stored in buffer 312A. The third data block may write over the first data block in some embodiments. During receipt of the third data block, the second data block may be transferred to an address within partition 314B, and a read operation may be performed on a data block within the partition 314A. The read operation at this step may be the first data block, but may also be another data block stored within partition 314A. If, however, the read needs to take place from the same partition as the transfer, such as partition 314A, the transfer may be temporarily slowed or halted and then resumed after the read has completed.

To continue the example, a fourth data block may be received and stored in buffer 312B, which may over write the second data block. During receipt of the fourth data block, the third data block may be transferred to an address within partition 314A, and a read operation may be performed on a data block within partition 314B. The output driver 318 may drive the data blocks from the read operations.

Figure 4:
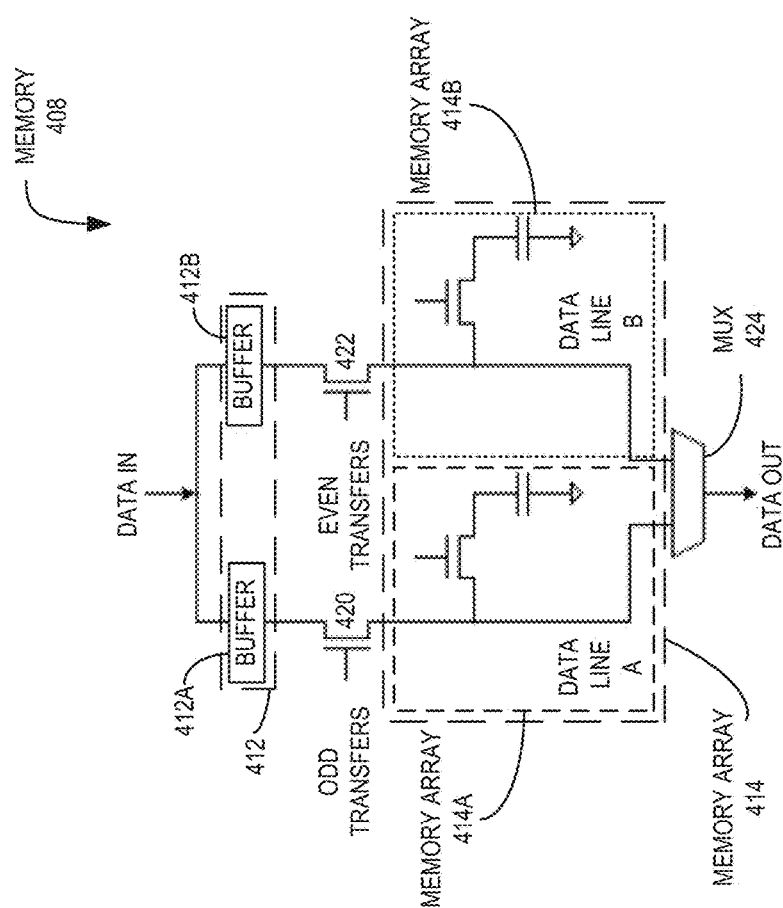
FIG. 4 is a simplified schematic of a memory in accordance with an embodiment of the present disclosure.

FIG. 4 is a simplified schematic of a memory 408 in accordance with an embodiment of the present disclosure. The memory 408 is one example of the memories 108, 208, and/or 308. The illustrated embodiment of the memory 408 includes a buffer 412, transfer gates 420 and 422, a memory array 414 and a multiplexer (MUX) 424.

The buffer 412 may be part of an input port, such as the input port 211. Additionally, the buffer 412 may be partitioned into two to form buffers 412A and 412B, or may include two separate buffers 412A and 412B. The buffers 412A and 412B may be one bit deep and a plurality of bits long in some embodiments. For example, the buffers 412A and 412B may be one bit deep by 3840 bits wide. As discussed above, data blocks received by the memory 408 may be 3840 bits wide. However, the buffers 412A and 412B may be any size (width and depth) desirable and still fall within the bounds of the present disclosure.

The buffers 412A and 412B may be coupled to respective partitions of the memory array 414 via transfer gates 420 and 422, respectively. The transfer gates 420 and 422 may be transistors that couple data lines of the buffers 412A and 412B to data lines of the memory 414. For example, buffer 412A may be coupled to DATA LINE A via transfer gate 420. Under control signals provided by control logic, such as the control logic 216 or the controller 104, the transfer gates 420 and 422 may be alternately enabled to couple data in their respective buffers 412A and 412B to addresses in respective partitions of the memory array 414.

The memory array 414 may be partitioned into two to form partitions 414A and 414B. The partitions 414A and 414B may be equal in size, e.g., number of rows and in width, and may also have similar or the same bit widths as do their respective buffers 412A and 412B. In some embodiments, the buffer 412 may be a single row of the memory array 414. For example, the memory 414 may have 65 rows with the buffer 412 being row 0. In such an embodiment, the transfer of data blocks from the buffer 412 to the memory array 414A may only require a memory address offset and the write address for received data blocks may be the address for row 0. As such, the memory address offset may point to row 1 through row 65. Accordingly, the memory address offset may require less bits to designate an address.

An output port, such as output port 209, may at least include the MUX 424 coupled to the data lines of partitions 414A and 414B. The MUX 424 may couple the data lines of one of the two partitions 414A and 414B to an output of the memory 408 in response to a control signal, for example.

Figure 5A:
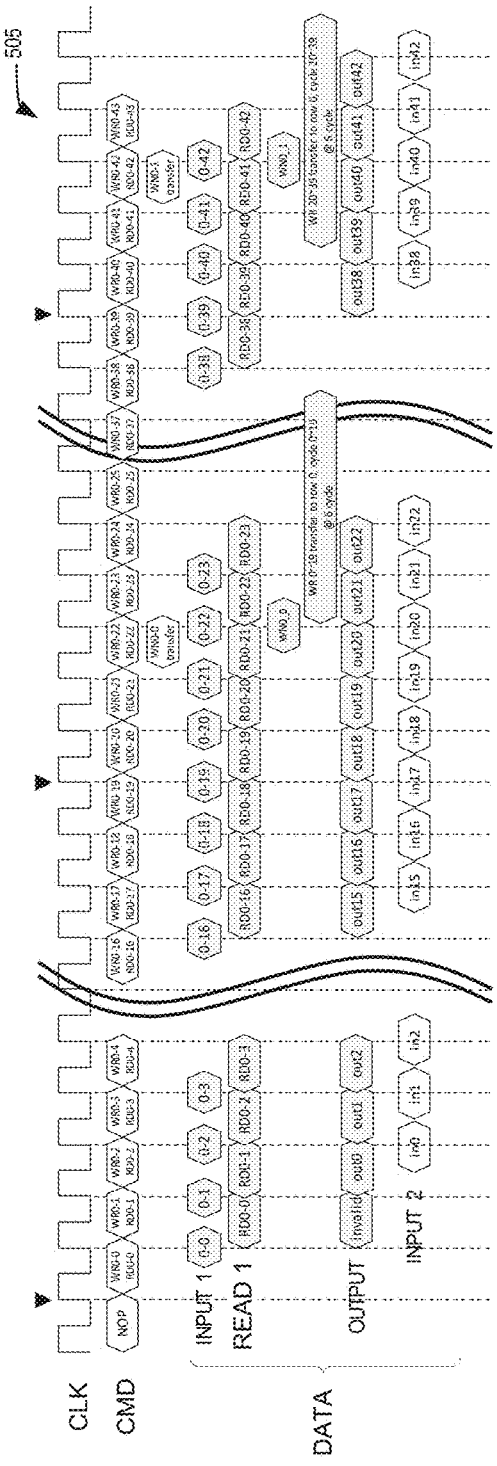
FIGS. 5A and 5B are timing diagrams for a memory in accordance with an embodiment of the present disclosure.
Figure 5B:
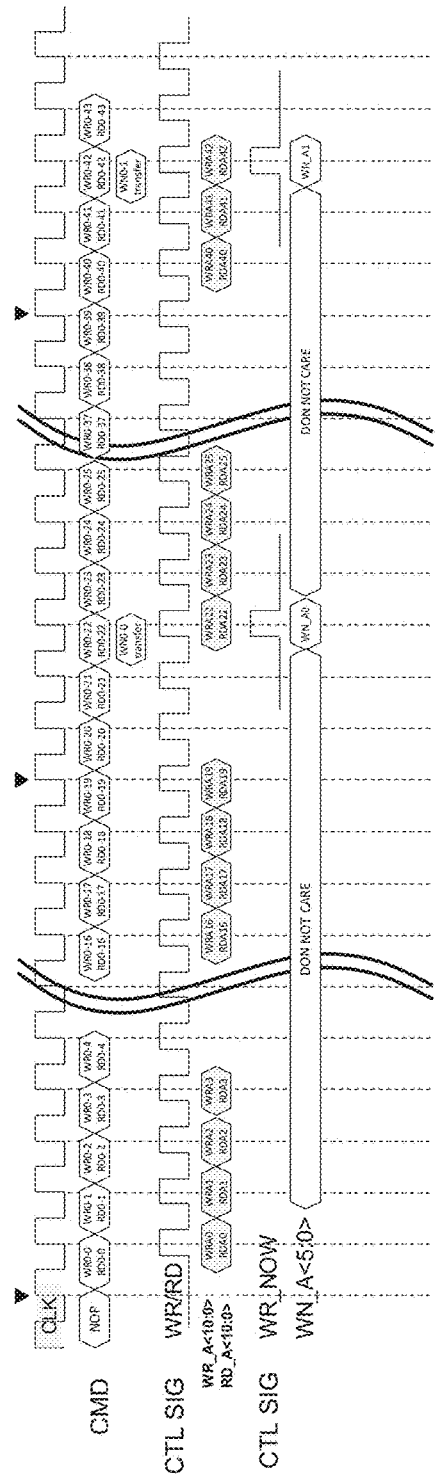

FIGS. 5A and 5B are timing diagrams 505 and 515, respectively, for a memory in accordance with an embodiment of the present disclosure. The timing diagrams 505 and 515 will be used to discuss the operation of the memories 108, 208, 308 and/or 408. FIG. 5A shows commands and the movement of associated data into, out of and within a memory, while FIG. 5B shows associated command, address information, and strobe signals, e.g., control signals.

The timing diagram 505 shows a clock signal CLK across the top. The clock signal may be an example of the clock signal CLK of FIG. 3. Directly under the clock signal is a row of memory commands labeled CMD, with each command including both a read command and a write command. For example, an initial no operation command (NOP) is followed by a write 0-0 (WR0-0) command and a paired read 0-0 (RD0-0) command. These commands continue through 0-43, shown at the far right. The data is shown below the commands. For example, a top line of the data shown input data 0-0 through 0-42. As discussed above, a data block may take 20 clock cycles to be written into an input buffer, such as the buffer 312A for example. Accordingly, the INPUT 1 line from 0-0 to 0-19 would represent the receipt of a single data block into a first input buffer. In some embodiments, each data 0-0, 0-1, 0-2, etc. may represent 128 received bits or 192 received bits plus parity/ECC bits. As such, data 0-0 through 0-19 may represent 2560 bits or 3480 bits including parity/ECC bits, which would combine to form a single data block. A second data block represented by 0-20 through 0-39 would be received into a second input buffer. For reference, the triangles at the top of the timing diagram 505 show the end and beginning of subsequent data blocks. The line of data under INPUT 1 is READ 1 data. The READ 1 data may be data read from a memory array partition, such as partition 314A or 314B. The READ 1 data may be provided as the OUTPUT data as well. INPUT 2 would be a next group of data blocks.

The timing diagram 515 also shows the CLK signal and the CMD signals along with address information, and control signals. For example, under the CMD line is the write, not read (WR/RD) control signal, and under the WR/RD control signal is shown the addresses for the writes and the reads. In some embodiments, each address for the write may be the same address, e.g., WR0-0 to WR0-19 may be the same address, and the same may go for the read address. Under the address information is a control signal for the transfer operation, labeled WR_NOW. The transfer operation occurs based on a single pulse, e.g., a strobe. The address for the transfer operation is shown below the associated control signal. As can be seen, the address information for the write and read operations is 11 bits in length (e.g., <10:0>), whereas the address information for the transfer operation is only 6 bits in length (e.g., <5:0>). The difference in address length may be due to the use of indexing for designating the transfer address. For example, the write address may designate the address location of the input buffer, such as buffer 312A, and the transfer address may indicate a memory address indexed from the input buffer address. Such indexing may be used in embodiments where the input buffer is a row of the associated memory array, for example.

Taking timing diagrams 505 and 515 together, the movement of data into, within, and out of the example memory 308 will be discussed. On the rising edge of twenty clock cycles, data 0-0 through 0-19 of INPUT 1 will be clocked into buffer 312A, for example. After each four consecutive clock cycles, for example, a sub-block that includes 192 bits may be written into the buffer 312A. As such, after 20 clock cycles, 3840 bits may be written into buffer 312A. Simultaneously with clocking in the INPUT 1 data, data out 0 through out 19 of the OUTPUT data may be read out from a location within partition 314A. In some embodiments, the OUTPUT data may be the READ 1 data. In other embodiments, OUTPUT and READ 1 data may be different data. In such an embodiment, the OUTPUT data may have been earlier read data that prepared for being driven out by an output port, such as the output driver 318.

To further illustrate, in response to the WR0-0 and RD0-0 commands, the WR/RD control signal may transition high. The transition to high of the WR/RD signal may data 0-0 to be written to address WRA0 and may further cause data RD0-0 to be read from RDA0. Addresses WRA0 and RDA0 may be associated with a same memory array, such as partition 312A, since the buffer being written into is associated with the partition being read from. However, the partition being transferred to is associated with the other buffer, such as 312B. After the read and write commands associated with the first data block complete, a transfer command WN0-0 may occur. The transfer command may cause the control signal WR_NOW to pulse high, which may cause data from buffer 312B, for example, to be transferred to a memory address of partition 314B. The receiving address of the transfer is indicated by the index of WN_A<5:0>.

The sequence of commands and data movement may continue, but the buffers and partitions may flip. For example, the second data block of INPUT 1 may be written into buffer 312B, data from partition 312B may be read, and data from buffer 312A may be transferred to partition 314A.

After all the first data block of INPUT 1, e.g., data 0-0 through 0-19, has been written into the buffer 312A, a transfer of data from the buffer 312B may occur. The transfer command WN_NOW may strobe in response to the occurrence of the WN0-0 transfer command. The transfer of the data block may only require six clock cycles, for example. While 6 cycles has been used to illustrate the transfer operation, other numbers of cycles may be implemented for the transfer operation, such as n cycles, where n may be 2, 5, 8, etc.

Figure 6:
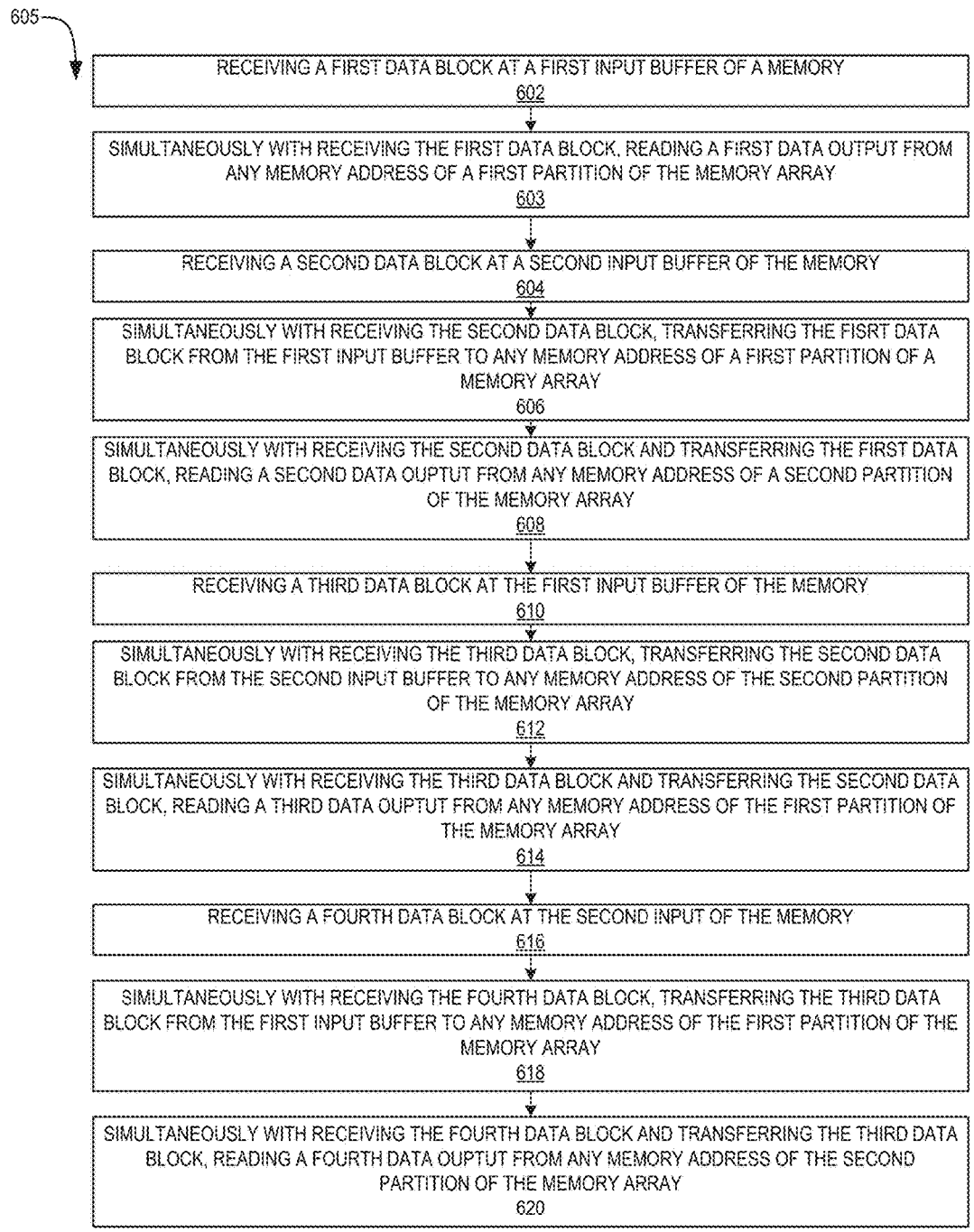
FIG. 6 is an example method for a memory in accordance with an embodiment of the present disclosure.

FIG. 6 is an example method 605 for a memory in accordance with an embodiment of the present disclosure. The method 605 may be implemented in the memories 108, 208, 308, and/or 408. The method 605 may provide one example for writing to, reading from, and performing an internal transfer operation for a memory as disclosed herein.

The method 605 may begin with process block 602, which includes receiving a first data block at a first input buffer of a memory. For example, the buffer 312A of the memory 308 may receive the first data block. Receiving the first data block may result in the first data block written into the first buffer in response to a write command, for example. The write command may be received by control logic of the memory, and provided by a host, for example.

Process block 602 may be followed by process block 603, which includes simultaneously with receiving the first data block, reading a first data output from any memory address of a first partition of the memory array. For example, a data block stored in partition 314A may be read out by the memory 308. The address of the memory location of where the first data output is stored does not affect the method 605.

Process block 603 may be followed by process block 604, which includes receiving a second data block at a second input buffer of the memory. For example, the buffer 312B of the memory 308 may receive the second data block. The second data block may be written into the second buffer in response to a received write command, for example. In addition to the write command, the memory may also receive a transfer command, and a read command. However, the transfer command may be generated internally by control logic of the memory, in some embodiments. As such, process blocks 606 and 608 may be performed nearly simultaneously with the write of the second data block to the second buffer. Process block 606 includes simultaneously with receiving the second data block, transferring the first data block from the first buffer to any memory address of the first partition of a memory array of the memory. And process block 608 includes simultaneously with receiving the second data block and transferring the first data block, reading a third data output from any memory address of a second partition of the memory array. Although process blocks 604, 606 and 608 are shown as separate processes, those three process blocks may be combined into a single process block, and their separate discussion is for purposes of clarity.

Process block 608 may be followed by process block 610, which includes receiving a third data block at the first input buffer of the memory. Receiving the third data block may include writing the third data block to the first input buffer. Similar to process blocks 606 and 608, process blocks 612 and 614 may be performed simultaneously with the performance of process block 610. For example, simultaneously with receiving/writing the third data block into the first input buffer, the second data block may be transferred from the second input buffer to any memory address of the second partition (process block 612), and a third data output may be read from any memory address of the first partition (process block 614). Again, the process blocks 610, 612 and 614 may be combined into a single operation, but for simplicity of discussion have been split into separate process blocks.

The method 605 may continue to alternate writing, transferring, and reading as is discussed with respect to process blocks 602-614. For example, process block 614 may be followed by process block 616, which includes receiving a fourth data block at the second input buffer of the memory, and simultaneously with receiving the fourth data block, transferring the third data block from the first input buffer to any memory address of the first partition (process block 618), and reading a fourth data output from any memory address of the second partition of the memory (process block 620).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A memory, comprising:
   an input port coupled to receive data blocks, wherein the input port incudes first and second buffers coupled to temporarily store alternate data blocks;
   a memory array partitioned into first and second partitions, wherein the first partition is coupled to receive data blocks from the first buffer and the second partition is coupled to receive data blocks from the second buffer; and
   an output port coupled to provide data blocks from the memory array,
   wherein the input port and the memory array are coupled to receive control signals to simultaneously receive a first data block at the first buffer, transfer a second data block from the second buffer to a first address in the second partition, and provide a third data block stored at a third address of the first partition via the output port.

2. The memory of claim 1, wherein the input port, in response to the control signals, causes a fourth data block to be received by the second buffer, transfer the first data block to a fourth address of the first partition, and provide a fifth data block stored at a fifth address of the second partition via the output port.

3. The memory of claim 1, wherein the first and second buffers are a row of the first and second partitions, respectively.

4. The memory of claim 1, wherein the output port includes a multiplexer coupled to receive data blocks from the first and second partitions of the memory array, and an output driver coupled to the data blocks as read data.

5. The memory of claim 1, wherein the memory is a dynamic access random memory, static random access memory, flash, magnetic random access memory, or phase change memory.

6. The memory of claim 1, further comprising control logic coupled to provide the control signals, and wherein the control logic generates a transfer command to cause the transfer of the second data block from the second buffer to the first address in the second partition.

7. The memory of claim 1, wherein the first data block is written into the first buffer over 20 clock cycles.

8. A display system, comprising:
   a digital interface coupled to receive video input, wherein the video input includes a plurality of data blocks;
   a display coupled to generate one or more images based on the data blocks;
   a memory coupled to receive the data blocks from a controller and temporarily store the data blocks prior to the display generating an image based thereon, the memory comprising:
      an input port coupled to receive data blocks, wherein the input port includes first and second buffers coupled to temporarily store alternate data blocks;

a memory array partitioned into first and second partitions, wherein the first partition is coupled to receive data blocks from the first buffer and the second partition is coupled to receive data blocks from the second buffer; and an output port coupled to provide data blocks from the memory array, wherein the input port and the memory array are coupled to receive control signals to simultaneously receive a first data block at the first buffer, transfer a second data block from the second buffer to a first address in the second partition, and provide a third data block stored at a third address of the first partition via the output port.

9. The display system of claim 8, wherein the first and second buffers are a row of the first and second partitions, respectively.

10. The display system of claim 8, wherein a clock signal is received by the memory, and the first data block is written into the first buffer over M cycles of the clock signal, wherein the third data block is read out by the memory over the same M clock cycles, and wherein the transfer of the second data block to the first address in the second partition occurs in N clock cycles, wherein N is less than M.

11. The display system of claim 8, wherein the display is a liquid crystal display.

12. The display system of claim 8, further comprising a controller coupled to receive the video input from the digital interface and provide the data blocks to the memory, wherein the controller manipulates the video input into the data blocks.

13. The display system of claim 8, wherein the memory is a dynamic random access memory.

14. A method comprising:
receiving a first data block at an input port of a memory;
temporarily storing the first data block in a first buffer of the memory;
simultaneously with receiving the first data block, transferring a second data block from a second buffer of the memory to a second address of a second partition of a memory array of the memory; and
simultaneously with receiving the first data block and transferring the second data block, reading a third data block from a third address of a first partition of the memory array.

15. The method of claim 14, further comprising:
receiving a fourth data block at the input port of the memory;
temporarily storing the fourth data block in the second buffer of the memory;
simultaneously with receiving the fourth data block, transferring the first data block from the first buffer to a first address of the first partition of the memory array; and
simultaneously with receiving the fourth data block and transferring the first data block, reading a fifth data block from a fifth address of the second partition of the memory array.

16. The method of claim 15, wherein temporarily storing the fourth data block in the second buffer of the memory includes writing over the second data block.

17. The method of claim 14, wherein reading a third data block from a third address of a first partition of the memory array comprises driving the third data block by an output port of the memory, the output port different than the input port.

18. The method of claim 14, wherein receiving a first data block at an input port of a memory comprises receiving data, command, and address information.

19. The method of claim 18, further comprising generating parity and error correction code for the first data block based on the data, the command and the address information.

20. The method of claim 14, wherein the memory is a dynamic random access memory, and the third data block is provided via an output port, the output port different than and separate from the input port.

* * * * *